United States Patent
Nakamura

(10) Patent No.: US 11,592,743 B2
(45) Date of Patent: *Feb. 28, 2023

(54) POSITIVE-TYPE PHOTOSENSITIVE RESIN COMPOSITION

(71) Applicant: HITACHI CHEMICAL DUPONT MICROSYSTEMS, LTD., Tokyo (JP)

(72) Inventor: Tadamitsu Nakamura, Hitachi (JP)

(73) Assignee: HD MICROSYSTEMS, LTD., Tokyo (JP)

( * ) Notice: Subject to any disclaimer, the term of this patent is extended or adjusted under 35 U.S.C. 154(b) by 181 days.

This patent is subject to a terminal disclaimer.

(21) Appl. No.: 16/075,416

(22) PCT Filed: Feb. 5, 2016

(86) PCT No.: PCT/JP2016/000617
§ 371 (c)(1),
(2) Date: Aug. 3, 2018

(87) PCT Pub. No.: WO2017/134700
PCT Pub. Date: Aug. 10, 2017

(65) Prior Publication Data
US 2019/0041748 A1   Feb. 7, 2019

(51) Int. Cl.
| | | |
|---|---|---|
| *G03F 7/023* | (2006.01) | |
| *G03F 7/022* | (2006.01) | |
| *G03F 7/004* | (2006.01) | |
| *G03F 7/039* | (2006.01) | |
| *G03F 7/40*  | (2006.01) | |

(52) U.S. Cl.
CPC .......... *G03F 7/0233* (2013.01); *G03F 7/0045* (2013.01); *G03F 7/023* (2013.01); *G03F 7/0226* (2013.01); *G03F 7/039* (2013.01); *G03F 7/0048* (2013.01); *G03F 7/40* (2013.01)

(58) Field of Classification Search
CPC ........ G03F 7/023; G03F 7/039; G03F 7/0233; G03F 7/0226
See application file for complete search history.

(56) References Cited

U.S. PATENT DOCUMENTS

| | | | |
|---|---|---|---|
| 2010/0092879 A1* | 4/2010 | Minegishi | C08G 69/26 430/18 |
| 2014/0120462 A1* | 5/2014 | Minegishi | G03F 7/0233 430/18 |
| 2019/0049842 A1* | 2/2019 | Matsukawa | G03F 7/162 |

FOREIGN PATENT DOCUMENTS

| | | |
|---|---|---|
| EP | 2133743 A1 | 12/2009 |
| JP | 2009-265520 A | 11/2009 |
| JP | 2010-266487 A | 11/2010 |
| JP | 5515399 B2 | 11/2010 |
| JP | 2011-148971 A | 8/2011 |
| JP | 2013-205801 A | 10/2013 |
| WO | 2009/081950 A1 | 7/2009 |
| WO | 2010/001780 A1 | 1/2010 |
| WO | 2011/135887 A1 | 11/2011 |
| WO | 2014/115233 A1 | 7/2014 |

OTHER PUBLICATIONS

"Semiconductor technology yearbook 2013 packaging/mounting guide", Nikkei Business Publications, Inc , Dec. 2012, pp. 41 to 50 (cited in specification).

* cited by examiner

*Primary Examiner* — Daborah Chacko-Davis
(74) *Attorney, Agent, or Firm* — Fitch, Even, Tabin & Flannery, LLP

(57) ABSTRACT

A positive-type photosensitive resin composition comprises a (a) polybenzoxazole precursor, a (b) crosslinking agent, a (c) photosensitive agent, and a (d) solvent, wherein the (a) component comprises a structural unit represented by Formula (1) below, and the (b) component is a compound represented by Formula (2) below. In Formula (1), U is a bivalent organic group, a single bond, —O—, or —SO$_2$—, V is a group comprising an aliphatic structure, and the carbon number in the aliphatic structure is 1 to 30. In Formula (2), R$_1$ is independently a hydrogen atom or a group represented by —CH$_2$—O—R$_2$. At least one of the plurality of R$_1$s is a group represented by —CH$_2$—O—R$_2$. R$_2$ is independently a hydrogen atom or an alkyl group having 1 to 6 carbon atoms.

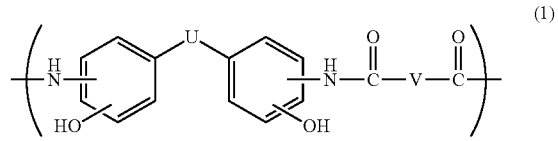

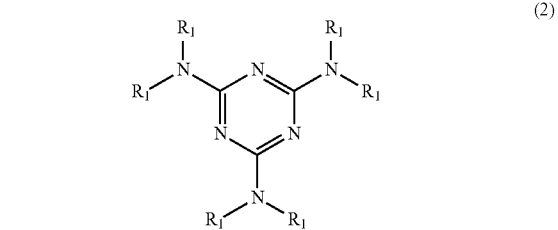

10 Claims, 3 Drawing Sheets

POSITIVE-TYPE PHOTOSENSITIVE RESIN COMPOSITION

CROSS-REFERENCE TO RELATED APPLICATIONS

This application is a U.S. national phase application filed under 35 U.S.C. § 371 of International Application No. PCT/JP2016/000617, filed Feb. 5, 2016, designating the United States, which is hereby incorporated herein by reference in its entirety.

TECHNICAL FIELD

The present invention relates to a positive-type photosensitive resin composition, a method of manufacturing a pattern cured film using the same, a cured film obtained from a positive-type photosensitive resin composition, an interlayer insulating film, a cover coat layer, or a surface protection film using the cured film, and an electronic component comprising the same.

BACKGROUND ART

Heretofore, polyimide having all of satisfactory heat resistance, electric properties, mechanical properties, and the like has been used for a surface protection film and an interlayer insulating film of a semiconductor device. In recent years, photosensitive polyimide obtained by giving photosensitive properties to polyimide itself has been used. By use of this photosensitive polyimide, a manufacturing process of a pattern cured film can be simplified, and a complicated manufacturing process can be shortened.

In the manufacturing process of a pattern cured film, an organic solvent such as N-methylpyrrolidone has been used in a development step. However, due to an environmental consideration, there has been suggested a resin composition that can be developed with an alkaline aqueous solution by a method in which a diazonaphthoquinone compound is mixed in polyimide or a polyimide precursor as a photosensitive agent (e.g., PATENT LITERATURES 1 and 2).

Meanwhile, in recent years, miniaturization of transistors that have supported the enhancement of performance of computers has come to the limit of scaling laws, and it is considered that technology of three-dimensionally stacking semiconductor elements is required for higher performance and higher speeds. Against this background, there has been suggested a three-dimensional package using a through silicon via (TSV), a 2.5-dimensional package using an interposer, or a 2.1-dimensional package, and stacked device structures typified by the above have been attracting attention (e.g., NON PATENT LITERATURE 1).

Among the stacked device structures, multi-die fanout wafer level packaging is a package manufactured by collectively sealing a plurality of dies in one package, and has been attracting much attention because lower cost and higher performance can be expected than in a conventionally suggested fanout wafer level package manufactured by sealing one die in one package.

In the production of a stacked device structure such as the multi-die fanout wafer level package, rewiring is performed after a diced chip is sealed. However, due to poor heat resistance of a sealing material, an interlayer sealing film for rewiring curable at low temperature is requested.

On the other hand, film properties, especially, adhesion properties of polyimide or polybenzoxazole have had a tendency to more deteriorate at lower cure temperature. Particularly, when curing is conducted at 200° C. or less, properties of adhesion to various substrates have been lower.

CITATION LIST

Patent Literature

[PATENT LITERATURE 1] Japanese Unexamined Patent Application Publication No. 2009-265520
[PATENT LITERATURE 2] International Publication No. 2014/115233 pamphlet

Non Patent Literature

[NON PATENT LITERATURE 1] "Semiconductor technology yearbook 2013 packaging/mounting guide", Nikkei Business Publications, Inc., December 2012, pp. 41 to 50

SUMMARY OF INVENTION

An object of the present invention is to provide a positive-type photosensitive resin composition which has satisfactory properties of adhesion to various substrates such as an Si substrate even when cured at a low temperature of 200° C. or less. Another object is to provide a method of manufacturing a pattern cured film using the positive-type photosensitive resin composition, a cured film obtained from a positive-type photosensitive resin composition, an interlayer insulating film, a cover coat layer, or a surface protection film using the cured film, and an electronic component comprising the same.

The present inventors cured photosensitive resin compositions using crosslinking agents having different numbers of functional groups at 200° C., thereby evaluating adhesion properties. As a result, it was found that a conventionally widely used photosensitive resin composition in which a crosslinking agent was combined with a polybenzoxazole precursor had a low reactivity to the polybenzoxazole precursor, and had low properties of adhesion to an Si substrate after cured at 200° C. Moreover, it was found that a crosslinking agent having low reactivity remained in an unreacted state in the film after cured, and deteriorated adhesion properties after a pressure cooker test (PCT test).

As a result of further repeated studies in view of the above problems, the present inventors found that a resin composition exhibited satisfactory properties of adhesion to various substrates by combining a highly reactive crosslinking agent with a polybenzoxazole precursor, even when the resin composition was cured at a low temperature of 200° C. or less.

According to the present invention, the following positive-type photosensitive resin composition or the like is provided.

1. A positive-type photosensitive resin composition comprising a (a) polybenzoxazole precursor, a (b) crosslinking agent, a (c) photosensitive agent, and a (d) solvent, wherein
the (a) component comprises a structural unit represented by Formula (1) below, and the (b) component is a compound represented by Formula (2) below.

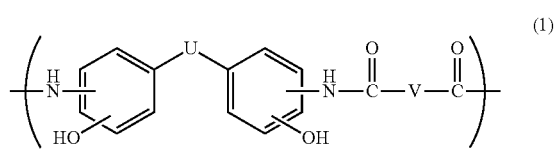

(In Formula (1), U is a bivalent organic group, a single bond, —O—, or —SO$_2$—, V is a group comprising an aliphatic structure, and the carbon number in the aliphatic structure is 1 to 30.)

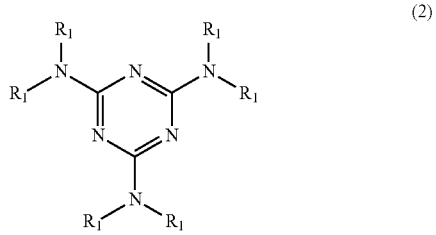

(2)

(In Formula (2), R$_1$ is independently a hydrogen atom or a group represented by —CH$_2$—O—R$_2$. At least one of the plurality of R$_1$s is a group represented by —CH$_2$—O—R$_2$. R$_2$ is independently a hydrogen atom or an alkyl group having 1 to 6 carbon atoms.)

2. The positive-type photosensitive resin composition according to 1, comprising 5 parts by mass or more of the (b) component with respect to 100 parts by mass of the (a) component.

3. The positive-type photosensitive resin composition according to 1 or 2, wherein the (c) component is a diazonaphthoquinone compound.

4. A method of manufacturing a pattern cured film, comprising:

coating the positive-type photosensitive resin composition according to any one of 1 to 3 on a substrate, drying the positive-type photosensitive resin composition, and thereby forming a photosensitive resin film;

exposing the photosensitive resin film to a predetermined pattern; developing the resin film after exposure by use of an alkaline aqueous solution, and thereby forming a pattern resin film; and heat-treating the pattern resin film.

5. The method of manufacturing the pattern cured film according to 4, wherein in heat-treating the pattern resin film, a heat treatment temperature is 250° C. or less.

6. A cured film obtained from the positive-type photosensitive resin composition according to any one of 1 to 3.

7. An interlayer insulating film, a cover coat layer, or a surface protection film using the cured film according to 6.

8. An electronic component comprising the interlayer insulating film, the cover coat layer, or the surface protection film according to 7.

According to the present invention, it is possible to provide a positive-type photosensitive resin composition which has satisfactory properties of adhesion to various substrates such as an Si substrate even when cured at a low temperature of 200° C. or less.

DESCRIPTION OF EMBODIMENTS

Figure 1:
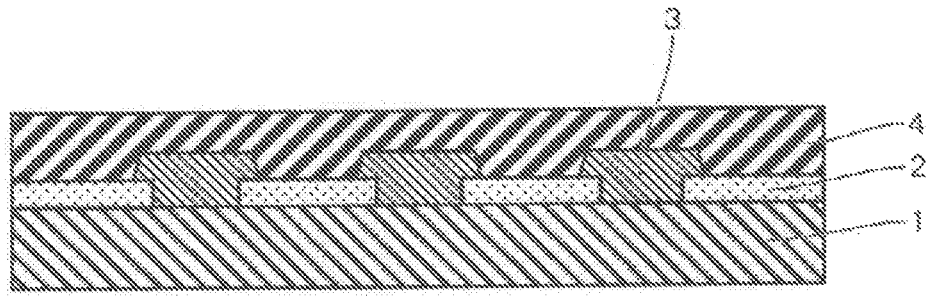
FIG. 1 is a schematic sectional view illustrating a manufacturing process of a fanout package having a multilayer wiring structure.
Figure 2:
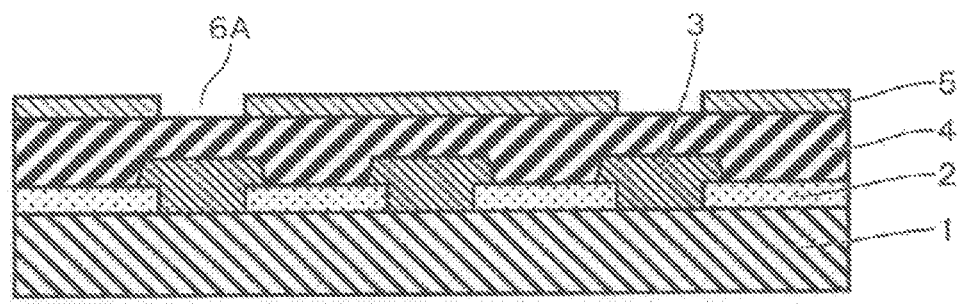
FIG. 2 is a schematic sectional view illustrating the manufacturing process of the fanout package having the multilayer wiring structure.
Figure 3:
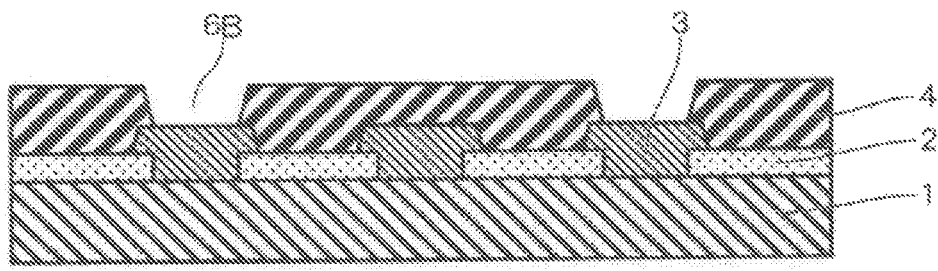
FIG. 3 is a schematic sectional view illustrating the manufacturing process of the fanout package having the multilayer wiring structure.

Hereinafter, described in detail are an embodiment of a positive-type photosensitive resin composition, a method of manufacturing a pattern cured film using the same, a cured film obtained from a positive-type photosensitive resin composition, an interlayer insulating film, a cover coat layer, or a surface protection film using the pattern cured film, and an electronic component comprising the same, according to the present invention. It is to be noted that the present invention is not limited by the following embodiment.

In the present description, when "A or B" is mentioned, one of A and B has only to be included, or both A and B may be included. Further, unless otherwise specified, the materials illustrated below may be used singly or may be used in combination of two or more kinds. Moreover, in the present description, the content of each component in a composition, when a plurality of substances corresponding to each component are present in the composition, means the total amount of the plurality of substances present in the composition, unless otherwise specified. In the present description, the term "step" includes not only an independent step, but also a step as long as a desired action of this step is achieved even when this step can not be clearly distinguished from other steps. A numerical range indicated by use of "to" refers to a range including numerical values described before and after "to" as minimum and maximum values, respectively.

[Positive-Type Photosensitive Resin Composition]

The positive-type photosensitive resin composition according to the present invention comprises a (a) polybenzoxazole precursor, a (b) crosslinking agent, a (c) photosensitive agent, and a (d) solvent. Hereinafter, these components may be simply referred to as a (a) component, a (b) component, a (c) component, and a (d) component. Each component is described below.

((a) Component: Polybenzoxazole Precursor)

The (a) component comprises a structural unit represented by Formula (1) below.

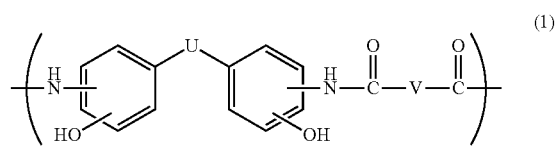

(1)

In Formula (1), U is a bivalent organic group, a single bond, —O—, or —SO$_2$—, V is a group comprising an aliphatic structure, and the carbon number in the aliphatic structure is 1 to 30.

With such a structure, the transmittance in an i-line which is a light source for use in patterning is higher.

The bivalent organic group which is U is preferably a group comprising an aliphatic structure having 1 to 30 carbon atoms, and more preferably a group comprising an aliphatic chain structure having 2 to 30 carbon atoms. The bivalent organic group which is U is preferably a group comprising a structure represented by Formula (UV1) below.

(UV1)

In Formula (UV1), $R^1$ and $R^2$ are independently a hydrogen atom, a fluorine atom, an alkyl group having 1 to 6 carbon atoms, or a fluorinated alkyl group having 1 to 6 carbon atoms, and a is an integer of 1 to 30.

$R^1$ and $R^2$ include, for example, a methyl group, a trifluoromethyl group, and the like. From the viewpoint of the transparency of the polybenzoxazole precursor, a trifluoromethyl group is preferable.

a is preferably an integer of 1 to 5.

The group comprising an aliphatic structure which is V includes a structure derived from dicarboxylic acid.

The dicarboxylic acid which is a raw material includes dodecanedioic acid, decanedioic acid, 2,2-bis (4-carboxyphenyl)-1,1,3,3,3-hexafluoropropane, 2,2-bis (p-carboxyphenyl) propane, 5-tert-butyl isophthalic acid, and the like. V includes a group obtained by removing two carboxyl groups from the above.

The polybenzoxazole precursor which is the (a) component may have, in a part thereof, a structural unit other than the structural unit represented by Formula (1). In this case, the proportion of the structural unit represented by Formula (1) to all the structural units is preferably 50 mol % or more, and more preferably 60 mol % or more.

The structural unit other than the structural unit represented by Formula (1) includes a structure unit in which V is a skeleton derived from a diphenylether compound, and the like.

The polybenzoxazole precursor is usually developed with an alkaline aqueous solution, and is therefore preferably soluble in the alkaline aqueous solution.

The alkaline aqueous solution includes an organic ammonium aqueous solution such as a tetramethylammonium hydroxide (TMAH) aqueous solution, a metal hydroxide aqueous solution, an organic amine aqueous solution, and the like. In general, a TMAH aqueous solution having a concentration of 2.38 mass % is preferably used. Thus, the (a) component is preferably soluble in the TMAH aqueous solution.

Incidentally, one standard for the (a) component to be soluble in the alkaline aqueous solution is described below. After the (a) component is dissolved into a given solvent resulting in a solution, a substrate such as a silicon wafer is spin-coated with the solution to form a resin film having a thickness of about 5 μm. This resin film is dipped in any one of the tetramethylammonium hydroxide aqueous solution, the metal hydroxide aqueous solution, and the organic amine aqueous solution at 20 to 25° C. When dissolved and resulting in a solution, the (a) component used is determined to be soluble in the alkaline aqueous solution.

The molecular weight of the polybenzoxazole precursor which is the (a) component preferably has a weight average molecular weight of 10,000 to 100,000 in terms of polystyrene, more preferably 15,000 to 100,000, and further preferably 20,000 to 85,000. When the weight average molecular weight is less than 10,000, there is concern that solubility into an alkaline developing solution is too high. When the weight average molecular weight is more than 100,000, there is concern that solubility into a solvent deteriorates, or the viscosity of the solution is increased and handleability deteriorates.

The weight average molecular weight can be measured by gel permeation chromatography, and can be found by conversion using a standard polystyrene calibration curve.

Further, dispersity in which the weight average molecular weight is divided by a number average molecular weight is preferably 1 to 4, and more preferably 1 to 3.

((b) Component: Crosslinking Agent)

The crosslinking agent which is the (b) component is a compound represented by Formula (2) below.

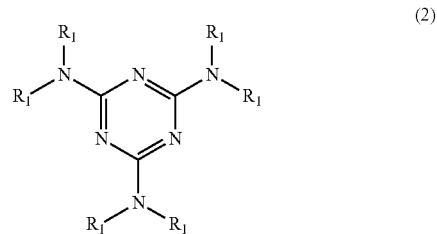

(2)

In Formula (2), $R_1$ is independently a hydrogen atom or a group represented by —$CH_2$—O—$R_2$. At least one of the plurality of $R_1$s is a group represented by —$CH_2$—O—$R_2$. $R_2$ is independently a hydrogen atom or an alkyl group having 1 to 6 carbon atoms.

The crosslinking agent which is the (b) component causes a reaction (crosslinking reaction) with the polybenzoxazole precursor even at a relatively low temperature, or the crosslinking agent itself is polymerized, in a step of heat-treating a pattern resin film after coating, exposing, and developing the positive-type photosensitive resin composition. Thus, even when the resin composition is cured at a relatively low temperature of, for example, 200° C. or less, it is possible to ensure satisfactory adhesion properties, mechanical properties, chemical resistance, and flux resistance.

Some of the plurality of $R_1$s may be —$CH_2$—O—$R_2$, or all of $R_1$s may be —$CH_2$—O—$R_2$. Preferably, all of $R_1$s are —$CH_2$—O—$R_2$.

The alkyl group having 1 to 6 carbon atoms which is $R_2$ includes a methyl group, an ethyl group, or a butyl group.

The compounding amount of the (b) component is preferably 1 part by mass or more to 100 parts by mass of the (a) component, more preferably 1 to 40 parts by mass, and further preferably 10 to 30 parts by mass.

((c) Component: Photosensitive Agent)

The positive-type photosensitive resin composition according to the present invention comprises a photosensitive agent as the (c) component together with the polybenzoxazole precursor which is the (a) component. The photosensitive agent is a compound which generates an acid when irradiated with active rays, and has a function of increasing the solubility of a part irradiated with light into an alkaline aqueous solution.

The photosensitive agent includes a diazonaphthoquinone compound, aryl diazonium salts, diaryliodonium salts, triarylsulfonium salts, and the like. Among others, the diazonaphthoquinone compound is highly sensitive and therefore preferable.

The diazonaphthoquinone compound is a compound having a diazonaphthoquinone structure.

The diazonaphthoquinone compound is obtained by, for example, causing a condensation reaction of o-quinonediazidesulfonylchlorides, a hydroxy compound, an amino compound, and the like in the presence of an antichlor.

As the o-quinonediazidesulfonylchlorides, it is possible to use, for example, 1,2-benzoquinone-2-diazide-4-sulfonylchloride, 1,2-naphthoquinone-2-diazide-5-sulfonylchloride, and 1,2-naphthoquinone-2-diazide-4-sulfonylchloride.

As the hydroxy compound, it is possible to use, for example, hydroquinone, resorcinol, pyrogallol, bisphenol A, bis (4-hydroxyphenyl) methane, 2,2-bis (4-hydroxyphenyl) hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis (2,3,4-trihydroxyphenyl) methane, bis (2,3,4-trihydroxyphenyl) propane, 4b,5,9b,10-tetrahydro-1,3,6,8-tetrahydroxy-5,10-dimethyl-indeno [2,1-a] indene, tris (4-hydroxyphenyl) methane, and tris (4-hydroxyphenyl) ethane.

As the amino compound, it is possible to use, for example, p-phenylenediamine, m-phenylenediamine, 4,4'-diaminodiphenyl ether, 4,4'-diaminodiphenylmethane, 4,4'-diaminodiphenylsulfone, 4,4'-diaminodiphenylsulfide, o-aminophenol, m-aminophenol, p-aminophenol, 3,3'-diamino-4,4'-dihydroxybiphenyl, 4,4'-diamino-3,3'-dihydroxybiphenyl, bis (3-amino-4-hydroxyphenyl) propane, bis (4-amino-3-hydroxyphenyl) propane, bis (3-amino-4-hydroxyphenyl) sulfone, bis (4-amino-3-hydroxyphenyl) sulfone, bis (3-amino-4-hydroxyphenyl) hexafluoropropane, and bis (4-amino-3-hydroxyphenyl) hexafluoropropane.

For satisfactory sensitivity and resolution during exposure, the compounding amount of the (c) component is preferably 0.01 to 50 parts by mass with respect to 100 parts by mass of the (a) component, more preferably 0.1 to 20 parts by mass, and further preferably 0.5 to 20 parts by mass.

((d) Component: Solvent)

The (d) component includes γ-butyrolactone, ethyllactate, propyleneglycolmonomethyletheracetate, benzylacetate, n-butylacetate, ethoxyethylpropionate, 3-methylmethoxypropionate, N-methyl-2-pyrrolidone, N,N-dimethylformamide, N,N-dimethylacetamide, dimethyl sulfoxide, hexamethylphosphorylamide, tetramethylenesulfone, cyclohexanone, cyclopentanone, diethylketone, diisobutylketone, methylamylketone, and the like. Normally, the (d) component is not particularly limited as long as other components in the photosensitive resin composition can be sufficiently dissolved.

Among the above, from the viewpoint of satisfactory solubility of each component and coating properties at the time of resin film formation, it is preferable to use γ-butyrolactone, ethyllactate, propyleneglycol monomethyletheracetate, N-methyl-2-pyrrolidone, N,N-dimethylformamide, N,N-dimethylacetamide, or dimethylsulfoxide.

The content of the (d) component is not particularly limited, but is preferably 50 to 400 parts by mass with respect to 100 parts by mass of the (a) component, more preferably 100 to 300 parts by mass, and further preferably 150 to 250 parts by mass.

The positive-type photosensitive resin composition according to the present invention may comprise, if necessary, a known coupling agent, a dissolution accelerator, a dissolution inhibitor, an interfacial active agent, a leveling agent, and the like other than the (c) component.

The positive-type photosensitive resin composition according to the present invention may consist essentially of the (a), (b), (c), and (d) components. For example, 80 mass % or more and 100 mass % or less (preferably 90 mass % or more and 100 mass % or less) of the positive-type photosensitive resin composition according to the present invention may be the above components. Alternatively, 95 mass % or more and 100 mass % or less, or 98 mass % or more and 100 mass % or less of the composition may be the above components. The positive-type photosensitive resin composition according to the present invention may consist of the (a), (b), (c), and (d) components alone. In this case, the composition may comprise inevitable impurities.

[Method of Manufacturing Pattern Cured Film]

A method of manufacturing a pattern cured film according to the present invention comprises a step of coating the positive-type photosensitive resin composition on a substrate, drying the positive-type photosensitive resin composition, and thereby forming a photosensitive resin film; a step of exposing the photosensitive resin film to a predetermined pattern; a step of developing the resin film after exposure by use of an alkaline aqueous solution, and thereby forming a pattern resin film; and a step of heat-treating the pattern resin film.

Each step is described below.

(Photosensitive Resin Film Forming Step)

In the present step, a substrate is coated with the positive-type photosensitive resin composition, the positive-type photosensitive resin composition is dried, whereby a photosensitive resin film is formed.

The substrate includes glass, semiconductor, a metal oxide insulator such as $TiO_2$ and $SiO_2$, silicon nitride, copper, a copper alloy, and the like. While there is no particular limitation on the coating method, a spinner or the like can be used for coating.

Drying can be conducted by use of a hot plate, an oven, or the like. A heating temperature is preferably 100 to 150° C. A heating time is preferably 30 seconds to 5 minutes. Thus, it is possible to obtain a photosensitive resin film in which the positive type photosensitive resin composition is formed into a film shape.

The thickness of the photosensitive resin film is preferably 5 to 100 μm, more preferably 8 to 50 μm, and further preferably 10 to 30 μm.

(Exposure Step)

In the present step, the photosensitive resin film is exposed to a predetermined pattern via a mask.

Active rays to be applied include ultraviolet rays comprising an i-line, visible rays, radiation rays, and the like. The i-line is preferable. As an exposure device, it is possible to use a parallel exposure machine, a projection exposure machine, a stepper, a scanner exposure machine, or the like.

(Development Step)

By developing the resin film which has undergone the exposure step, it is possible to obtain a resin film in which a pattern is formed (pattern resin film). Generally, when a positive type photosensitive resin composition is used, the exposed part is removed with a developing solution.

An alkaline aqueous solution can be used as the developing solution. The alkaline aqueous solution includes sodium hydroxide, potassium hydroxide, sodium silicate, ammonia, ethylamine, diethylamine, triethylamine, triethanolamine, tetramethylammonium hydroxide, and the like. Tetramethylammonium hydroxide is preferable.

The concentration of the alkaline aqueous solution is preferably 0.1 to 10 mass %.

The development time varies depending on the kind of polybenzoxazole precursor used, but is preferably 10 seconds to 15 minutes, more preferably 10 seconds to 5 minutes, and further preferably 30 seconds to 4 minutes from the viewpoint of productivity.

An alcohol or an interfacial active agent may be added to the above developing solution. The addition amount is preferably 0.01 to 10 parts by mass with respect to 100 parts by mass of the developing solution, and more preferably 0.1 to 5 parts by mass.

(Heat Treatment Step)

By heat-treating the pattern resin film, it is possible to form a crosslinked structure between the functional groups of the (a) component, between the (a) component and the (b) component, or the like, and obtain a pattern cured film. The polybenzoxazole precursor which is the (a) component causes a dehydration ring-closing reaction by the heat treatment step, and can be corresponding polybenzoxazole.

The heating temperature is preferably 250° C. or less, more preferably 120 to 250° C., and further preferably 160 to 230° C. Within this range, it is possible to hold down the damage to the substrate or the device, produce the device with a satisfactory yield, and achieve energy saving of a process. Using the positive-type photosensitive resin composition according to the present invention, it is possible to obtain a cured film having satisfactory properties of adhesion to various substrates by a heat treatment at 200° C. or less, for example, 175° C.

The heating time is preferably 5 hours or less, and more preferably 30 minutes to 3 hours. Within this range, it is possible to sufficiently carry out a crosslinking reaction or a dehydration ring-closing reaction. Moreover, the atmosphere of the heat treatment may be atmospheric air or inert atmosphere of nitrogen or the like, but is preferably nitrogen atmosphere from the viewpoint of being able to prevent the oxidation of the pattern resin film.

The device used for the heat treatment step includes a quartz tube furnace, a hot plate, rapid thermal annealing, a vertical diffusion furnace, an infrared curing oven, an electron beam curing oven, a microwave curing oven, and the like.

[Process of Manufacturing Semiconductor Device]

Figure 8:
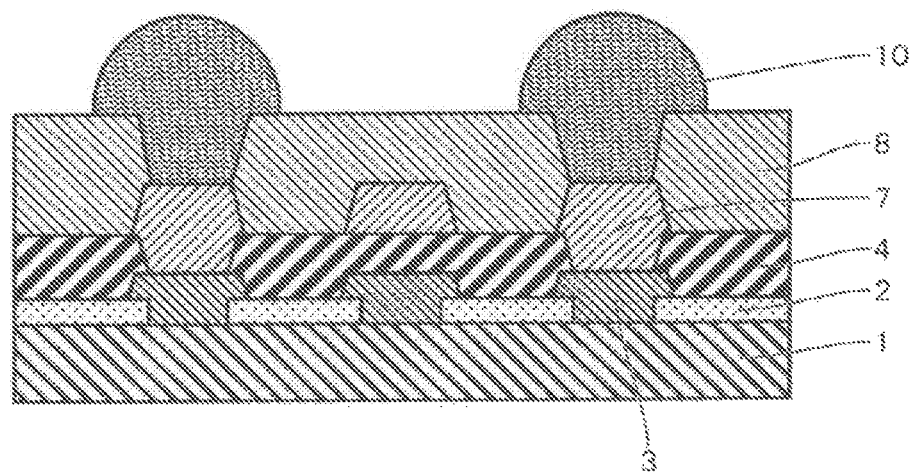
FIG. 8 is a schematic sectional view of a fanout package having an under bump metal (UBM) free structure.

Next, as an example of a process of manufacturing a pattern cured film according to the present invention, a process of manufacturing a semiconductor device is described with reference to the drawings. FIGS. 1 to 7 are schematic sectional views illustrating a process of manufacturing a fanout package having a multilayer wiring structure, and represent a series of steps from a first step to a seventh step. FIG. 8 is a schematic sectional view of a fanout package having an under bump metal (UBM) free structure.

In these drawings, a semiconductor substrate 1 such as an Si substrate having a circuit element (not shown) is covered with a protection film 2 such as a silicon oxide film except for predetermined parts of the circuit element, and a first conductor layer 3 is formed on the exposed circuit element.

Thereon, a film of a polyimide resin or the like is formed by a spin coat method or the like as an interlayer insulating film 4 (first step, FIG. 1).

Next, a photosensitive resin layer 5 based on chlorinated rubber, phenol novolak, or the like is formed on the interlayer insulating film 4 by the spin coat method. Using the photosensitive resin layer 5 as a mask, a window 6A is provided by a known method so that the interlayer insulating film 4 in the predetermined parts is exposed (second step, FIG. 2).

The interlayer insulating film 4 exposed in the window 6A part is selectively etched by dry etching means using a gas such as oxygen or carbon tetrafluoride, and a window 6B is formed. Then, the photosensitive resin layer 5 is completely removed by use of an etching solution such that the first conductor layer 3 exposed from the window 6B is not corroded and the photosensitive resin layer 5 is only corroded (third step, FIG. 3).

Figure 4:
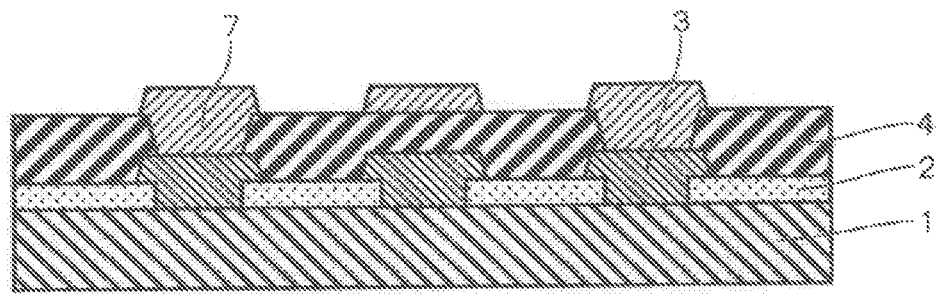
FIG. 4 is a schematic sectional view illustrating the manufacturing process of the fanout package having the multilayer wiring structure.
Figure 5:
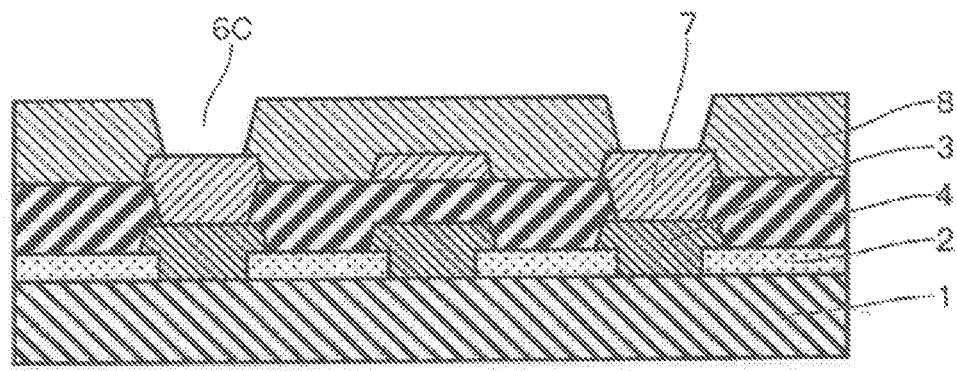
FIG. 5 is a schematic sectional view illustrating the manufacturing process of the fanout package having the multilayer wiring structure.
Figure 6:
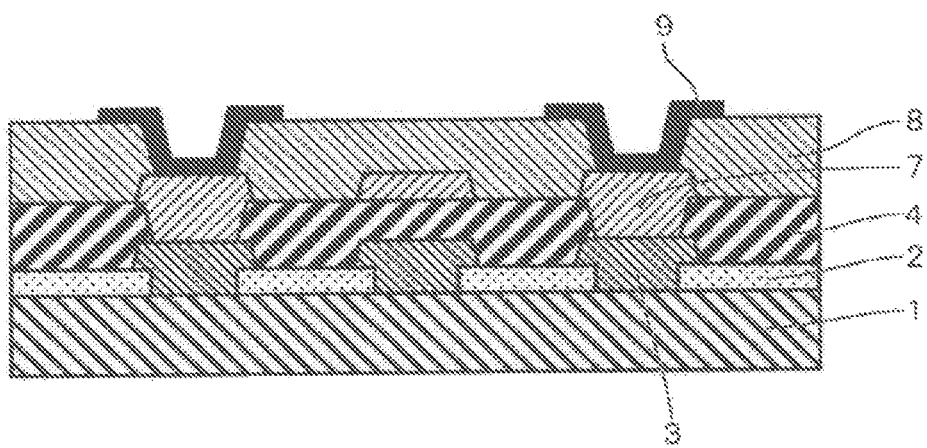
FIG. 6 is a schematic sectional view illustrating the manufacturing process of the fanout package having the multilayer wiring structure.
Figure 7:
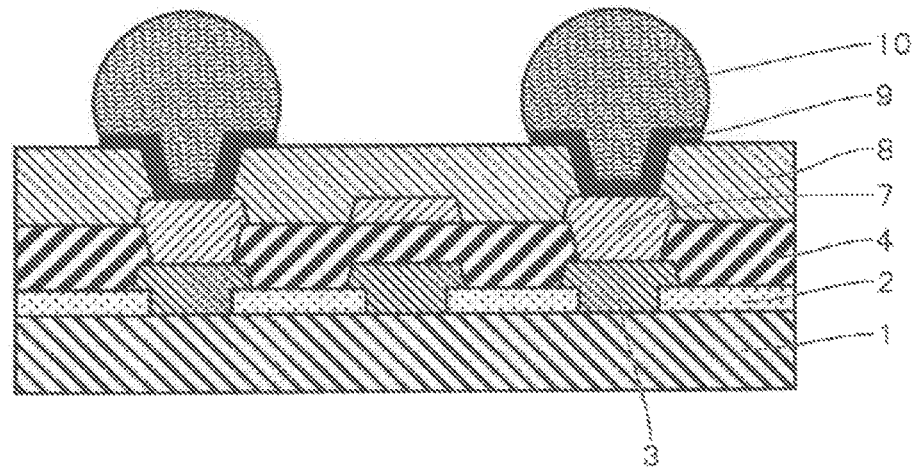
FIG. 7 is a schematic sectional view illustrating the manufacturing process of the fanout package having the multilayer wiring structure.

Further, by use of a known method, a second conductor layer 7 is formed, and electrically connected to the first conductor layer 3 (fourth step, FIG. 4). When a multilayer wiring structure having three or more layers is formed, the steps described above are repeated, and each layer is formed.

Next, a surface protection film 8 is formed by use of the positive-type photosensitive resin composition according to the present invention as below. That is, the resin composition of the present invention is subjected to coating by a spin coat method, dried, irradiated with light from above a mask having a pattern drawn to form a window 6C in a predetermined part, and then developed with an alkaline aqueous solution, whereby a pattern resin film is formed. Thereafter, this pattern resin film is heated, and thus used as a pattern cured film of polybenzoxazole, that is, the surface protection film 8 (fifth step, FIG. 5). The surface protection film 8 (pattern cured film of polybenzoxazole) functions to protect the conductor layer from external stress, α-rays, and the like.

Furthermore, normally, after a metal thin film is formed on the surface of the surface protection film 8 by a sputtering process, a plating resist is formed in accordance with the window 6C by use of a known method, and a metal layer 9 called an under bump metal (UBM) is precipitated in an exposed metal thin film portion by plating. Then, the plating resist is stripped, and a metal foil film in a part other than the area where the metal layer 9 is formed is removed by etching to form a UBM (sixth step, FIG. 6). Further, an external connection terminal 10 called a bump is formed on the surface of the metal layer 9 (seventh step, FIG. 7). The metal layer 9 is formed for the purpose of easing stress acting on the bump 10 and improving electrical connection reliability.

In recent years, from the viewpoint of manufacturing cost reduction, there has been suggested a UBM free structure in which in order to omit the step of forming such a metal layer 9 (UBM), the bump 10 is directly formed after the window 6C is formed in the surface protection film 8. In the UBM free structure, in order to suppress an electrical resistance increase due to the generation of an intermetallic compound, it is preferable that the second conductor layer 7 to be connected to the bump 10 is formed with a larger thickness than usual. Moreover, it is preferable that the stress acting on the bump 10 is eased by the surface protection film 8 alone. Thus, it is preferable to form a thicker surface protection film 8 in order to cover the second conductor layer 7 formed with a large thickness, and enhance stress relaxation performance (FIG. 8). Therefore, in the UBM free structure, when the window 6C is formed in the surface protection film 8, it is preferable to coat with a thicker resin film, and expose and develop the resin film.

[Electronic Component]

Next, the electronic component according to the present invention is described. The electronic component according to the present invention comprises a cured film obtained from the positive-type photosensitive resin composition according to the present invention. Specifically, it is possible to have a pattern cured film obtained by the above-described method of manufacturing the pattern cured film.

Specifically, the cured film (pattern cured film) can be used as a surface protection film for an electronic component, a cover coat layer, an interlayer insulating film, an interlayer insulating film of a multilayer wiring board, or the like.

The electronic device includes a semiconductor device, a multilayer wiring board, various electronic devices, and the like. Although the above-mentioned semiconductor device is one embodiment of the electronic component according to the present invention, the semiconductor device is not limited to the above, and can have various structures.

EXAMPLES

Hereinafter, the present invention is more specifically described on the basis of Examples and Comparative Examples. It is to be noted that the present invention is not limited to Examples below.

(a) Synthesis of Polybenzoxazole Precursor

Synthesis Example 1

60 g of N-methylpyrrolidone was fed into a flask of 0.2 liters equipped with a stirrer and a thermometer, and 13.92 g (38 mmol) of 2,2-bis (3-amino-4-hydroxyphenyl) hexafluoropropane was added and dissolved by stirring. Further, while the temperature was maintained at 0 to 5° C., 10.69 g (40 mmol) of dodecanedioic acid dichloride was dropped for 10 minutes, and then the solution in the flask was stirred for 60 minutes. The above-described solution was poured into 3 liters of water, a precipitate was collected, and a resultant product was washed with pure water three times and then depressurized, whereby polyhydroxyamide (polybenzoxazole precursor) was obtained (hereinafter, referred to as a polymer I). The weight average molecular weight of the polymer I was 33,100, and the dispersity thereof was 2.0. The weight average molecular weight was found by gel permeation chromatography (GPC) in terms of standard polystyrene.

Measurement conditions of the weight average molecular weight by the GPC are as below. Measurement was conducted by use of a solution including 1 ml of a solvent [tetrahydrofuran (THF)/dimethylformamide (DMF)=1/1 (volume ratio)] to 0.5 mg of a polymer.
Measurement device: detector, L4000 manufactured by Hitachi, Ltd.
UV Pump: L6000 manufactured by Hitachi, Ltd.
C-R4A Chromatopac manufactured by Shimadzu Corporation
Measurement conditions: column Gelpack GL-S300MDT-5×2
Eluent: THF/DMF=1/1 (volume ratio)
LiBr (0.03 mol/), H$_3$PO$_4$ (0.06 mol/1)
Flow rate: 1.0 ml/min
Detector: UV270 nm Synthesis Example 2

10.69 g (40 mmol) of dodecanedioic acid dichloride used in Synthesis Example 1 was replaced by 7.48 g (28 mmol) of decanedioic acid dichloride and 3.56 g (12 mmol) of 4,4'-diphenylether dicarboxylic acid dichloride. Except for the above, synthesis was conducted as in Synthesis Example 1, and polyhydroxyamide was obtained (hereinafter, referred to as a polymer II). The weight average molecular weight of the polymer II was 41,800, and the dispersity thereof was 2.0.

Synthesis Example 3

60 g of N-methylpyrrolidone was fed into a flask of 0.2 liters equipped with a stirrer and a thermometer, and 13.92 g (38 mmol) of 2,2-bis (3-amino-4-hydroxyphenyl) hexafluoropropane was added and dissolved by stirring. Then, while the temperature was maintained at 0 to 5° C., 11.86 g (40 mmol) of 4,4'-diphenylether dicarboxylic acid dichloride was dropped for 10 minutes. Thereafter, the temperature was returned to room temperature, and the solution in the flask was stirred for 3 hours. The above-described solution was poured into 3 liters of water, a precipitate was collected, and a resultant product was washed with pure water three times and then depressurized, whereby polyhydroxyamide was obtained (hereinafter, referred to as a polymer III). The weight average molecular weight of the polymer III was 22,400, and the dispersity thereof was 3.2.

Examples 1 to 10, Comparative Examples 1 to 5

[Preparation of Photosensitive Resin Composition]

The respective components were mixed in accordance with the components and the compounding amounts shown in Table 1, and a photosensitive resin composition was prepared. The compounding amounts shown in Table 1 are the parts by mass of each component with respect to 100 parts by mass of the (a) component.

The respective components used in Examples 1 to 10 and Comparative Examples 1 to 5 are as below.
<(a) Component: Polybenzoxazole Precursor>
Polymer I: polymer I obtained in Synthesis Example 1
Polymer II: polymer II obtained in Synthesis Example 2
<(a') Component: Polybenzoxazole Precursor>
Polymer III: Polymer III obtained in Synthesis Example 3
<(b) Component: Crosslinking Agent>
(b-1): acid-modified alkylated melamineformaldehyde having the following structure (manufactured by Allnex Corporation, trade name "Cymel 300")

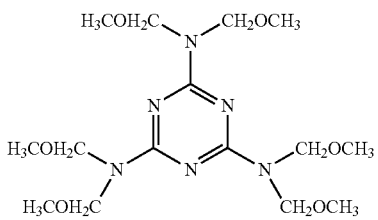

<(b') Component: Crosslinking Agent>
(b-2): methylated urea resin having the following structure (manufactured by SANWA CHEMICAL CO., LTD., trade name "NIKALAC MX-270")

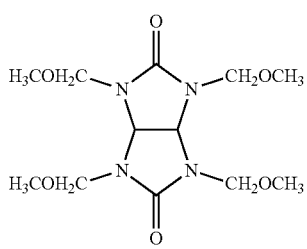

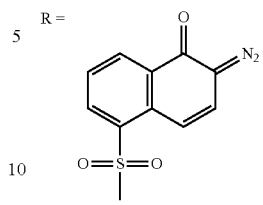

<(c) Component: Photosensitive Agent>

(c-1): compound having the following structure (manufactured by Daito Chemix Corporation, trade name "TPPA428")

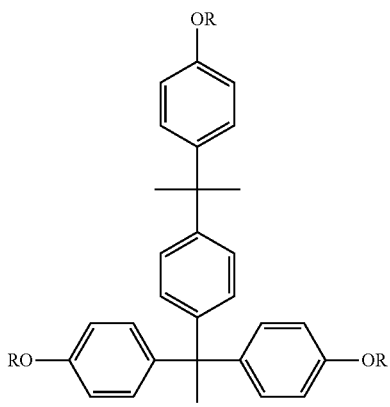

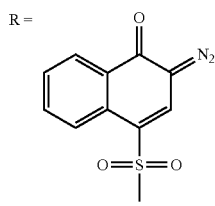

(c-2): compound having the following structure (manufactured by Daito Chemix Corporation, trade name "TPPA528")

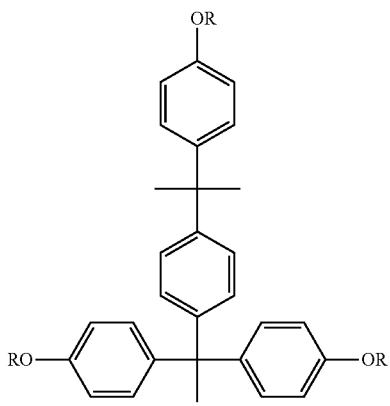

<(d) Component: Solvent>

BLO: γ-butyrolactone

NMP: N-methylpyrrolidone

[Manufacture of Cured Film]

An Si substrate and a Cu substrate were spin-coated with the obtained photosensitive resin composition, and a coating film having a dry film thickness of 7 to 12 μm was formed. The obtained substrate with the resin film was heated for 30 minutes at 100° C. under nitrogen atmosphere by use of a vertical diffusion furnace μ-TF (manufactured by Koyo Thermo Systems Co., Ltd.), and then further heated for 1 hour at 175° C. or 200° C. Thus, a cured film having a thickness of 5 to 10 μm after cured was obtained.

[Initial Adhesion Evaluation]

A cross cut test was performed on the obtained cured film, and properties of adhesion to the Si substrate and the Cu substrate were evaluated. Specifically, first, eleven parallel lines were drawn at intervals of 1 mm in each of the orthogonal vertical and horizontal directions by use of a cutter guide in the center of the surface of the cured film on the substrate, and grid-pattern cuts were made so that 100 squares were formed within 1 cm². Then a peeling test using a cellophane tape was performed on the grid pattern, and the number of squares remaining on the substrate after the test was counted.

The case with 100 remaining squares is indicated by ◯, the case with 1 to 99 remaining squares is indicated by Δ, and the case without any remaining squares is indicated by X. The results are shown in Table 1. In the case of Δ, the number of remaining squares is also shown.

[Adhesion Properties Evaluation after PCT Treatment]

The cured film was put in a pressure cooker apparatus, and treated under the conditions of 121° C., 2 atm, and RH of 100% for 100 hours (PCT treatment). Thereafter, a peeling test was performed as in the case of the initial adhesion properties, and the adhesion properties were evaluated. The results are shown in Table 1.

TABLE 1

|  |  |  | Examples |  |  |  |  |  |  |  |  |  | Comparative Examples |  |  |  |  |
|---|---|---|---|---|---|---|---|---|---|---|---|---|---|---|---|---|---|
|  |  |  | 1 | 2 | 3 | 4 | 5 | 6 | 7 | 8 | 9 | 10 | 1 | 2 | 3 | 4 | 5 |
| Positive-type photosensitive resin composition | (a) component | I | 100 | 100 | 100 | 90 | 100 | 100 | 100 | 100 | 0 | 100 | 100 | 70 | 70 | 100 | 0 |
|  |  | II | 0 | 0 | 0 | 0 | 0 | 0 | 0 | 0 | 100 | 0 | 0 | 0 | 0 | 0 | 0 |
|  | (a') component | III | 0 | 0 | 0 | 10 | 0 | 0 | 0 | 0 | 0 | 0 | 0 | 30 | 30 | 0 | 100 |
|  | (b) component | b-1 | 15 | 20 | 25 | 25 | 15 | 20 | 25 | 12 | 25 | 25 | 0 | 0 | 0 | 0 | 25 |
|  | (b') component | b-2 | 0 | 0 | 0 | 0 | 0 | 0 | 0 | 12 | 0 | 0 | 25 | 15 | 25 | 20 | 0 |
|  | (c) component | c-1 | 0 | 0 | 0 | 0 | 11 | 11 | 11 | 11 | 0 | 11 | 0 | 0 | 0 | 0 | 0 |
|  |  | c-2 | 11 | 11 | 11 | 11 | 0 | 0 | 0 | 0 | 11 | 0 | 11 | 11 | 11 | 11 | 11 |
|  | (d) component | BLO | 200 | 200 | 200 | 200 | 200 | 200 | 200 | 200 | 200 | 0 | 200 | 200 | 200 | 200 | 200 |
|  |  | NMP | 0 | 0 | 0 | 0 | 0 | 0 | 0 | 0 | 0 | 200 | 0 | 0 | 0 | 0 | 0 |
| Adhesion properties evaluation (Si substrate) (cure temperature: 175° C.) | | Initial | ○ | ○ | ○ | ○ | ○ | ○ | ○ | ○ | ○ | ○ | x | x | x | x | ○ |
|  | | After PCT treatment | ○ | ○ | ○ | ○ | Δ 25 | Δ 25 | Δ 25 | Δ 15 | ○ | ○ | x | x | x | x | x |
| Adhesion properties evaluation (Cu substrate) (cure temperature: 200° C.) | | Initial | ○ | ○ | ○ | ○ | ○ | ○ | ○ | ○ | ○ | ○ | x | ○ | ○ | ○ | x |
|  | | After PCT treatment | ○ | ○ | ○ | ○ | ○ | ○ | ○ | ○ | ○ | ○ | x | ○ | ○ | ○ | x |

From Table 1, it can be seen that the cured film obtained from the positive-type photosensitive resin composition according to the present invention has satisfactory properties of adhesion to both of the Si substrate and the Cu substrate.

While several embodiments and/or examples according to the present invention have been described above in detail, those skilled in the art can easily make numerous modifications to these illustrative embodiments and/or examples substantially without departing from the novel teachings and advantages of the present invention. Thus, these numerous modifications fall within the scope of the present invention.

The entire contents of the documents described in this description are incorporated herein by reference.

The invention claimed is:

1. A positive-type photosensitive resin composition comprising a (a) polybenzoxazole precursor, a (b) crosslinking agent, a (c) photosensitive agent, and a (d) solvent, wherein the (a) component comprises a structural unit represented by Formula (1) below, the (b) component is a compound represented by Formula (2) below, and the (c) photosensitive agent is a compound represented by Formula c-2 below:

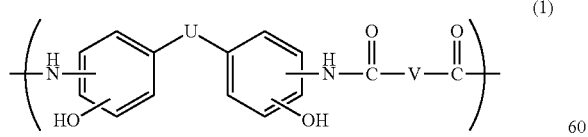

(1)

wherein, in Formula (1), U is a bivalent organic group, a single bond, —O—, or —SO$_2$—, V is a bivalent aliphatic group having 1 to 30 carbon atoms,

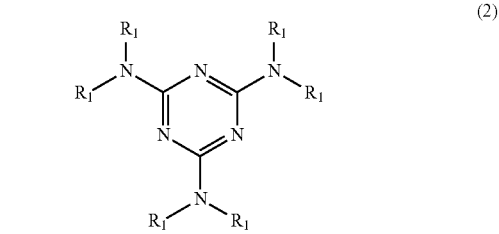

(2)

wherein, in Formula (2), R$_1$ is independently a hydrogen atom or a group represented by —CH$_2$—O—R$_2$ At least one of the plurality of R$_1$s is a group represented by —CH$_2$—O—R$_2$ R$_2$ is independently a hydrogen atom or an alkyl group having 1 to 6 carbon atoms, and wherein the (c) photosensitive agent is 0.1 to 20 parts by mass with respect to 100 parts by mass of the (a) polybenzoxazole precursor

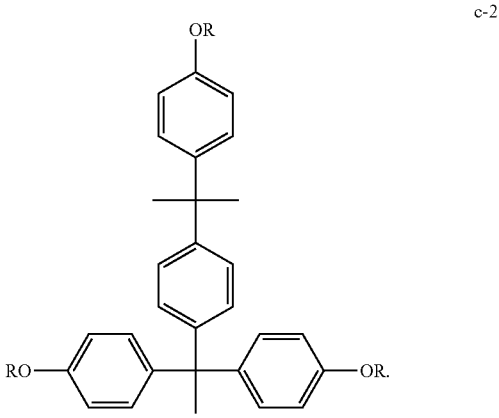

c-2

R = 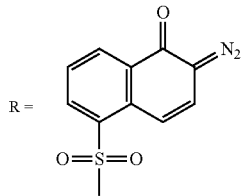

2. The positive-type photosensitive resin composition according to claim 1, comprising 5 parts by mass or more of the (b) component with respect to 100 parts by mass of the (a) component.

3. A method of manufacturing a pattern cured film, comprising:
coating the positive-type photosensitive resin composition according to claim 1 on a substrate, drying the positive-type photosensitive resin composition, and thereby forming a photosensitive resin film;
exposing the photosensitive resin film to a predetermined pattern;
developing the resin film after exposure by use of an alkaline aqueous solution, and thereby forming a pattern resin film; and
heat-treating the pattern resin film.

4. The method of manufacturing the pattern cured film according to claim 3, wherein in heat-treating the pattern resin film, a heat treatment temperature is 250° C. or less.

5. A cured film obtained from the positive-type photosensitive resin composition according to claim 1.

6. An interlayer insulating film, a cover coat layer, or a surface protection film using the cured film according to claim 5.

7. An electronic component comprising the interlayer insulating film, the cover coat layer, or the surface protection film according to claim 6.

8. The positive-type photosensitive resin composition according to claim 1, wherein V is a group obtained by removing two carboxyl groups from dodecanedioic acid or a group obtained by removing two carboxyl groups from decanedioic acid.

9. The positive-type photosensitive resin composition according to claim 1, wherein the (b) component comprises an acid-modified alkylated melamineformaldehyde having the following structure:

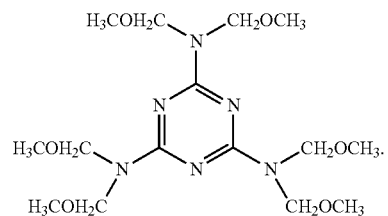

10. The positive-type photosensitive resin composition according to claim 1, wherein the (c) photosensitive agent is 0.5 to 20 parts by mass with respect to 100 parts by mass of the (a) polybenzoxazole precursor.

* * * * *